(12) United States Patent
Lesso

(10) Patent No.: US 6,856,202 B2
(45) Date of Patent: Feb. 15, 2005

(54) PHASE/FREQUENCY DETECTOR AND PHASE LOCK LOOP CIRCUIT

(75) Inventor: Paul Lesso, Edinburgh (GB)

(73) Assignee: Wolfson Microelectronics, plc, Edinburgh (GB)

(*) Notice: Subject to any disclaimer, the term of this patent is extended or adjusted under 35 U.S.C. 154(b) by 68 days.

(21) Appl. No.: 10/459,606

(22) Filed: Jun. 12, 2003

(65) Prior Publication Data
US 2004/0201425 A1 Oct. 14, 2004

(30) Foreign Application Priority Data

Apr. 14, 2003 (GB) ................................. 0308611

(51) Int. Cl.[7] .................. H03L 7/085; H03L 7/095; H03D 13/00
(52) U.S. Cl. .................. 331/1 A; 331/25; 331/DIG. 2; 327/12
(58) Field of Search .................. 331/1 A, 10, 11, 331/17, 25, DIG. 2; 327/2, 7, 12, 156–159

(56) References Cited

U.S. PATENT DOCUMENTS 4,902,920 A * 2/1990 Wolaver .................. 327/12
6,256,362 B1 7/2001 Goldman
6,265,902 B1 7/2001 Klemmer et al.
6,404,240 B1 6/2002 Hakkal et al.
6,441,691 B1 8/2002 Jones et al.
6,466,058 B1 10/2002 Goldman
2002/0126787 A1 9/2002 Homol et al.

* cited by examiner

Primary Examiner—David Mis
(74) Attorney, Agent, or Firm—Dickstein Shapiro Morin & Oshinsky LLP

(57) ABSTRACT

The present invention relates to cycle slip detectors for phase and frequency detectors (PFD) and to lock detectors for phase lock loop (PLL) circuits. The present invention provides a cycle slip detector circuit for use with a phase and frequency detector circuit having first and second signal inputs, and arranged to provide first and second PLL control signal outputs responsive to clock edges in the first and second input signals respectively; the cycle slip detector circuit comprising: means for determining a cycle slip between said input signals by determining when a delayed output signal coincides with a respective input signal.

22 Claims, 9 Drawing Sheets

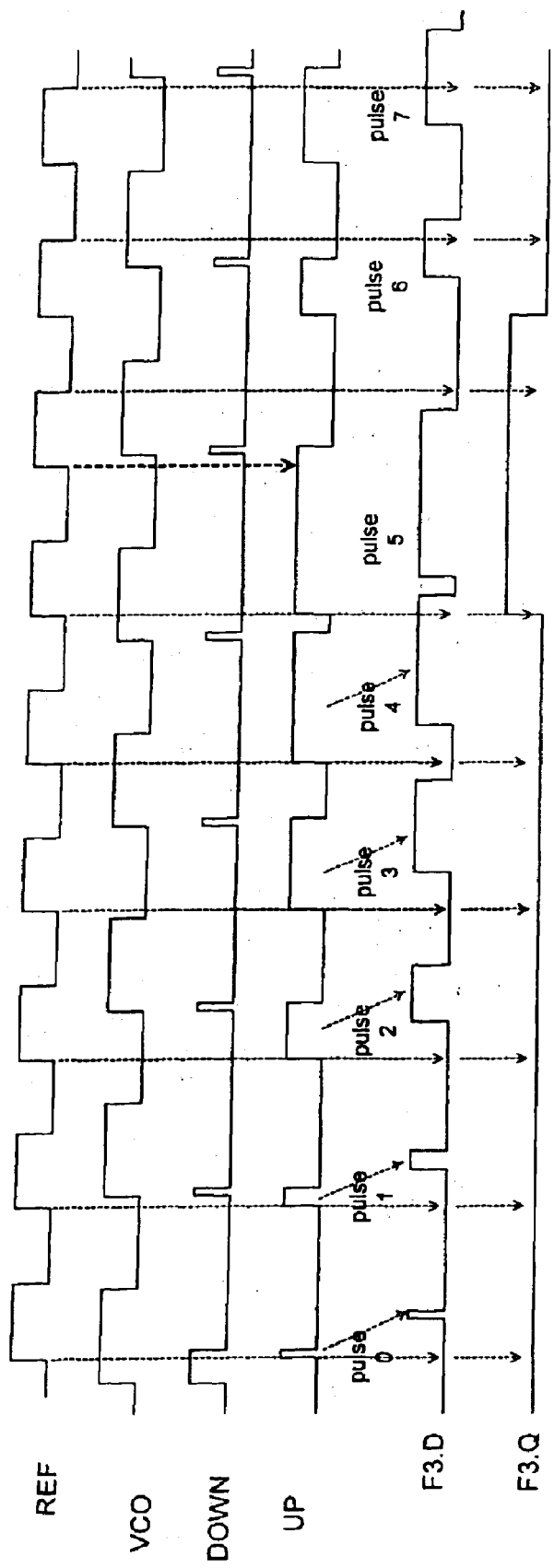
Fig 5 (new)

PHASE/FREQUENCY DETECTOR AND PHASE LOCK LOOP CIRCUIT

FIELD OF THE INVENTION

The present invention relates to cycle slip detectors for phase and frequency detectors (PFD) and to lock detectors for phase lock loop (PLL) circuits.

BACKGROUND OF THE INVENTION

Phase lock loops (PLL) are well-known circuits that are used to lock a locally generated signal such as a clock signal to an external or reference signal. This might be applied for example in telecommunications receiver equipment or digital audio equipment which receives a reference signal and needs to generate a local clock signal whose frequency and phase are related to the received reference signal (a condition known as lock) in order to properly receive incoming information signals. A schematic of a PLL is shown in FIG. 1 and comprises a phase and frequency detector (PFD), a charge pump (CP), a loop filter (LF) and an oscillator (VCO) in a feedback loop. The detector (PFD) detects the frequency or phase difference between the signal output by the oscillator (VCO) (the derived clock) and a reference signal (the reference clock). The detector outputs an error signal which is proportional to the frequency and phase difference between the two input signals, which in turn controls the frequency output of the oscillator. This feedback loop allows the generated signal to converge in frequency towards the reference signal. In some implementations either the generated clock from the VCO, or the system reference clock, or both, may be divided in frequency to provide a generated clock at a fixed ratio of frequency to the system reference clock.

The Phase and Frequency Detector (PFD) is also a well-known circuit, an example of which is shown in FIG. 2a. The PFD generates two outputs (UP and DOWN) which are used to control the charge pump or similar controller driving the loop filter which in turn controls the error voltage to the VCO input in order to control the VCO output frequency. A simple PFD typically comprises two flip flop circuits L1 and L2 and a NAND gate N. Taking the rising clock edge from the reference signal rising first, flip flop L1 will latch first so that a reference voltage, usually one of the supply rails Vcc, will be output at Q, and hence at the UP output. This is followed by the corresponding clock edge from the oscillator signal or derived clock, which latches flip flop L2 to provide Vcc at its output Q (the DOWN signal). This together with the Vcc output Q of L1 triggers the NAND gate N to reset both flip flops L1 and L2, such that their outputs Q remain at ground or 0V until the next rising clock edge at their inputs. The UP and DOWN signal waveforms can be seen in FIG. 2b. The duration of the DOWN output is small and related to the propagation time through the NAND gate N and the reset circuitry of the flip-flops L1 and L2. The duration of the UP output however is related to the time difference between the rising edge of the Reference signal and the Derived signal. The larger this time difference, the larger the duration of the UP output pulse. Similarly, if the Derived signal leads the Reference signal, output pulses will appear on the DOWN output which are proportional to the amount of the lead. The UP and DOWN outputs feed a controller such as a charge pump which generates an increase or decrease in the loop filter output voltage depending on which signal leads, and this in turn either slightly increases or decreases the VCO's output frequency as appropriate.

As long as the phase difference between the reference and derived clocks remains less than $2\pi$, the output pulse duration is proportional to the phase difference, and the PFD is said to be in phase acquisition mode. When the reference and derived clocks differ by more than $2\pi$ phase difference the operation of the PFD is qualitatively different. FIG. 3a illustrates what happens when the phase difference between the two signals accumulates to exceed $2\pi$. In the case illustrated, the derived clock (DER) waveform is slightly lower in frequency than the reference clock (REF) waveform. Initially (pulse 0), DER leads REF, and the duration of the UP signal (pulse 1), is defined by the propagation delay through NAND gate N and flip-flop L1. At pulse 1, the phase difference is small, so the duration of the UP pulse is also small. As the phase difference increases, the UP signal extends (pulse 2, pulse 3) until it extends over almost the full cycle (pulse 4), as the rising edge of DER occurs only just in time to reset the UP pulse. By the next cycle (pulse 5), no rising edge of DER has occurred by the second rising edge of REF, so UP stays high, and is only reset when DER rises, which happens shortly after this second rising edge of REF. UP then stays low for most of a REF cycle, until the next rising edge of REF generates pulse 6. This pulse is still quite narrow, similar to pulse 2. For this example, with a fixed frequency difference, the chain of events will repeat. So, although the phase difference between DER and REF increases monotonically, the duty cycle of the UP pulses follows a saw-tooth pattern, with discontinuities approximately every $2\pi$.

A similar characteristic for the DOWN pulses will occur if REF progressively lags DER. This can be graphically illustrated by the PFD transfer characteristic of the PFD shown in FIG. 3b. The PFD characteristic clearly shows a series of discontinuities at multiples of $2\pi$, as the output duty cycle repeatedly ramps up to a maximum and then abruptly drops down to zero.

In the context of a PFD operating in a complete PLL, as DER slips relative to REF (or vice versa), this will be seen as the width of UP or DOWN pulses suddenly decreasing during the lock process, as can be seen in FIG. 3a. These discontinuities in the stimulus applied to the subsequent loop filter will cause discontinuities in the slope of the loop filter output voltage, i.e. in the VCO control voltage. Typically the dynamics of the loop filter will show changes in slope polarity at the time when these cycle slips occur, as illustrated in the simulated behaviour shown in FIG. 3c which shows the VCO control voltage when cycle slips are occurring—the troughs in the waveform are symptomatic of cycle slips. When cycle slips are occurring, the dynamic behaviour of the PLL is non-linear, and the behaviour can deviate away from that dictated by linear control theory, generally resulting in increased lock times.

By detecting cycle slips, the VCO control voltage can be adjusted or "corrected" to avoid or minimise these discontinuities and thus improve the lock time of the PLL. Various cycle slip detectors and control voltage correction circuits also known as cycle-slip compensation circuits are described in U.S. Pat. Nos. 6,265,902, 6,466,058, 6,256,362 and US2002/0126787.

In U.S. Pat. No. 6,265,902 the PFD is coupled to two cycle slip detector and correction circuits each comprising an edge triggered counter together with logic circuitry which adds to the UP or DOWN output signals when a respective cycle slip is detected. This is achieved by detecting if the UP (or DOWN) signal is still asserted when a next reference (or derived) signal edge is received. The counter outputs a correction signal, which is combined (OR'ed) with the respective UP or DOWN output. The duration of the correction signal is determined by a load value, which the counter receives as an input.

In U.S. Pat. No. 6,256,362, a more complex PFD is utilised together with cycle slip detectors comprising latches and logic circuitry which combined with a cycle slip counter circuit provide "corrected" UP2 and DOWN2 output signals.

In US2002/0126787, the PFD includes a delay element 36 in its reset circuitry in order to provide for a minimum UP or DOWN output pulse to aid linear operation of the PFD and subsequent charge pump. Lock detection, i.e. generation of a logic signal to flag that the loop and its output frequency have stabilized, is useful since the PLL must be in a stable mode of operation before the derived or generated clock can be reliably used by the rest of the system. Additionally the PLL lock time can be reduced by having a fast lock mode (i.e. wide loop bandwidth), which is used when the PLL is locking, and a slow mode (i.e. tight loop bandwidth), which is used when the PLL is locked.

Some lock detectors detect cycle slip in conjunctions with a complex state machine to determine the lock condition rather than the linear/non-linear modes of operation of the PFD. However a complex state machine can significantly increase cost. An example of this implementation is disclosed in U.S. Pat. No. 6,256,362. Similarly, U.S. Pat. No. 6,466,058 uses a cycle slip detector in tandem with an input signal presence detector.

Other types of lock detector utilise the phase alignment of the UP and DOWN signals, as disclosed in U.S. Pat. No. 6,404,240. However, the relative phasing of the UP and DOWN signals when the system is locked can depend on the operating conditions of the analog circuitry. For example, offsets in the PLL circuitry can give rise to a significant phase offset at the PLL inputs, even though the loop is adequately frequency-locked.

SUMMARY OF THE INVENTION

The present invention provides a cycle slip detector circuit, which can be combined with other circuit components to provide a lock detector circuit for a phase lock loop; a frequency or phase detection mode indicator for a phase and frequency detector and/or phase lock loop.

The cycle slip detector operates by determining whether a leading PLL control signal (UP or DOWN) from a PFD coincides with a respective input signal (REFERENCE CLOCK or DERIVED CLOCK in FIG. 2a). That is if the PFD output signal for say a leading reference clock signal input is still asserted when at the next reference signal's rising edge, then there has been a cycle slip between the reference signal input and the other input signal (the derived signal for example). In other words two reference signal rising edges have occurred between derived signal rising edges. This is because the output "lead" signal from the PFD indicates that a predetermined point in the reference signal input cycle has occurred, for example the leading positive or rising edge of a clock signal. When the equivalent point in the derived signal input cycle is asserted then the corresponding output signal from the PFD is arranged to, in combination with the lead output signal corresponding to the reference signal, reset the PFD so that both output signals return to "off" or zero. Thus if there is no cycle slip condition, the first or "lead" output will not be asserted or present when the next rising edge of the respective input signal occurs and a cycle slip will not be indicated. However if the lead signal is not reset by the other lead signal, then it will still be present when the next rising edge of its respective input signal occurs and a cycle slip will be indicated. That is if the "lead" or PFD output signal coincides with the next input signal cycle indication (for example the next rising clock edge) then a cycle slip has occurred.

The applicants have recognised however that, in practical implementations, there may exist one or a combination of the following conditions. 1) Very fast latching devices or circuits in the PFD which translate a rising edge in their respective input signal into a PLL control output signal (UP or DOWN) almost instantaneously such that the cycle slip latching devices or circuits used to determine whether their respective output signal coincides with the respective input signal may still be registering the input signal edge when the PFD output signal is asserted and hence may incorrectly register a cycle slip. 2) Alternatively or in addition, the cycle slip latches or circuits may be relatively slow to register input clock edges so that even with a relatively slow PFD latching device or circuit, the cycle slip latching means may be still registering the input clock edge when a PFD output signal is asserted and which itself was triggered by that same input clock edge.

In general terms the present invention provides a cycle slip detector having a PFD comprising first and second latching means coupled to respective input signals, for example reference clock and derived clock signals. These latching means each assert an output signal when a predetermined part, for example a rising edge, of their respective input signal waveform is detected. The PFD also comprises reset means comprising combinatorial logic, for example AND or NAND gates, which resets both latching means when both output signals are asserted. The cycle slip detector additionally has two cycle slip latching means, which are coupled to a respective PFD output and to a respective PFD input signal. These latching means each assert a respective cycle slip output signal when their respective PFD input signal waveform is detected, only if the respective PFD output signal, triggered by the previous same predetermined part of the respective PFD input signal waveform (for example a previous rising clock edge), is still asserted. If the respective PFD output signal has been reset during the interval between these predetermined parts of the respective input signal waveform, the cycle slip is not asserted, or if already asserted from a previous event, is indeed de-asserted. "Assert" implies both the timing of any transition, and its logical polarity as known in the art.

The cycle slip latching means respond at each predetermined part of the respective PFD input signal waveform to the state of the respective PFD output signal triggered by the previous predetermined part of the respective PFD input signal waveform. To avoid the cycle slip latching means responding at any predetermined part of the respective PFD input signal waveform to the state of the respective PFD output signal triggered by the same predetermined part of the respective PFD input signal waveform, a delay means is implemented in order to provide a predetermined delay time between assertion of the predetermined part of the PFD input signal waveform and detection by the respective cycle slip latching means of the respective PFD output triggered by said input waveform part. In one embodiment this is achieved by adding a delay element between each cycle slip latching means PFD input and their respective PFD output. The delay element can be implemented as one or more simple devices such as inverters or OR gates for example. Alternatively a more complex but more accurate delay may be desired, for example involving charging of capacitors by accurate current sources, or other well known means of delay.

This arrangement allows the use of high speed PFD latching means, such as NOR gate pairs, to be used whilst still maintaining proper operation of the cycle slip detector by avoiding false cycle slip indications due to fast latching by the PFD latching means and/or slow latching by the cycle slip latching means. The low number of circuit components required together with the simple circuit arrangement in terms of a small number of signal paths means that overall propagation delay in the circuit is reduced and so the circuit can operate at much higher frequencies compared with prior art arrangements. This arrangement also provides cost advantages through reduced component count and reduced connection complexity In particular in one aspect the present invention provides a cycle slip detector according to claim 1.

The cycle slip detector arrangement may comprise a combination of PFD and cycle slip latching means with internal circuit structures arranged such that the cycle slip latching means is always reset from a particular input signal event (such as a rising edge), before a PFD output signal corresponding to that event is asserted. This avoids the need for discrete delay components. For example predetermined delays may be embedded in the latching means.

In particular in another aspect the present invention provides a cycle slip detector circuit comprising a phase and frequency detector circuit having first and second signal inputs, and arranged to provide first and second PLL control signal outputs responsive to waveform edges in the first and second input signals respectively; and means for determining a cycle slip between said input signals by determining when a delayed output signal coincides with a respective input signal.

The determining means may comprise means for delaying a received output signal, and means for indicating a cycle slip if said delayed output signal is asserted when a next waveform edge is asserted by the respective input signal.

Preferably the cycle slip indicating means comprise latching means such as a flip-flop for example.

Preferably the determining means comprises a delay element coupled between each output signal from the PFD and an input of the respective latch means which is clocked by the respective input signal.

Preferably the output signal delay time is less than the remainder of the input signal period less the reset time of the phase and frequency detector.

In another aspect there is provided a method of determining a cycle slip in a phase lock loop comprising a phase and frequency detector having first and second signal inputs, and arranged to provide first and second PLL control signal outputs responsive to clock edges in the first and second input signals respectively; the method comprising:

determining a cycle slip between said input signals by determining when a delayed said output signal coincides with a respective input signal.

Preferably the determining comprises delaying said received output signal, and indicating a cycle slip if said delayed output signal is asserted when a next waveform edge is asserted by the respective input signal.

In another aspect there is provided a method of using a circuit comprising a delay means coupled to the input of a latching circuit in order to provide a cycle slip detector, the method comprising:

providing a phase and frequency detector circuit having first and second signal inputs, and arranged to provide first and second PLL control signal outputs responsive to clock edges in the first and second input signals respectively;

coupling the input of the delay means to a PLL control signal output and coupling a respective input signal to the clocking input of the latching means such that the output of the latching means indicates a cycle slip.

In general terms in another aspect, the present invention also provides a phase lock loop lock indicator. By combining a cycle slip detector circuit with a timer circuit, a lock condition in a PLL can be indicated when a cycle slip has not been indicated for a predetermined time. Cycle slips indicate that the two input signals have a different frequency or have an accumulated phase difference greater than $2\pi$.

Advantageously, the cycle slip detector utilised is that provided above by the first aspect of the invention. However other cycle slip detectors could alternatively be used, including those prior art arrangements described above.

In particular in a second aspect the present invention provides a phase lock loop lock detector comprising:

a cycle slip detector circuit comprising a phase and frequency detector circuit having first and second signal inputs, and arranged to provide first and second PLL control signal outputs responsive to waveform edges in the first and second input signals respectively; means for determining a cycle slip between said input signals by determining when a delayed output signal coincides with a respective input signal; and means for indicating lock when a cycle slip has not be asserted for a predetermined time.

In another aspect the present invention provides a phase lock loop lock detector comprising:

a cycle slip detector circuit comprising a phase and frequency detector circuit having first and second signal inputs, and arranged to provide first and second PLL control signal outputs responsive to waveform edges in the first and second input signals respectively; means for determining a cycle slip between said input signals; and means for indicating lock when a cycle slip has not be asserted for a predetermined time.

In another aspect there is provided a method of determining lock in a phase lock loop having a phase and frequency detector; the method comprising:

determining a cycle slip according to a method of determining a cycle slip in a phase lock loop comprising a phase and frequency detector having first and second signal inputs, and arranged to provide first and second PLL control signal outputs responsive to clock edges in the first and second input signals respectively; the method comprising:

determining a cycle slip between said input signals by determining when a delayed said output signal coincides with a respective input signal; and indicating lock when a cycle slip has not be asserted for a predetermined time.

In general terms in another aspect the present invention provides provided a phase or frequency mode indicator for a phase lock loop. This operates in a similar manner to the phase lock loop indicator by making use of the fact that the cycle slip indications indicate that the PLL is not in phase acquisition mode.

In another aspect there is provided a phase or frequency mode indicator for a phase lock loop having a phase and frequency detector having first and second signal inputs, and arranged to provide first and second PLL control signal outputs responsive to clock edges in the first and second input signals respectively; first and second cycle slip detector circuit comprising: means for determining a cycle slip between said input signals by determining when a delayed output signal coincides with a respective input signal; combinatorial logic means such as logical OR means taking inputs from the outputs of the first and second cycle slip detector circuits: and timer means coupled to the output of the combinatorial logic means and arranged to indicate phase detection mode when said output has not be asserted for a predetermined time.

BRIEF DESCRIPTION OF THE DRAWINGS

Embodiments of the present invention will now be described in detail with reference to the following drawings, by way of example only and without intending to be limiting, in which:

FIG. 2b shows the waveforms of the reference, derived, UP and DOWN signals from the PFD of FIG. 2a;

FIG. 5 shows a timing diagram showing signals in the circuit of FIG. 4;

DETAILED DESCRIPTION

Figure 4:
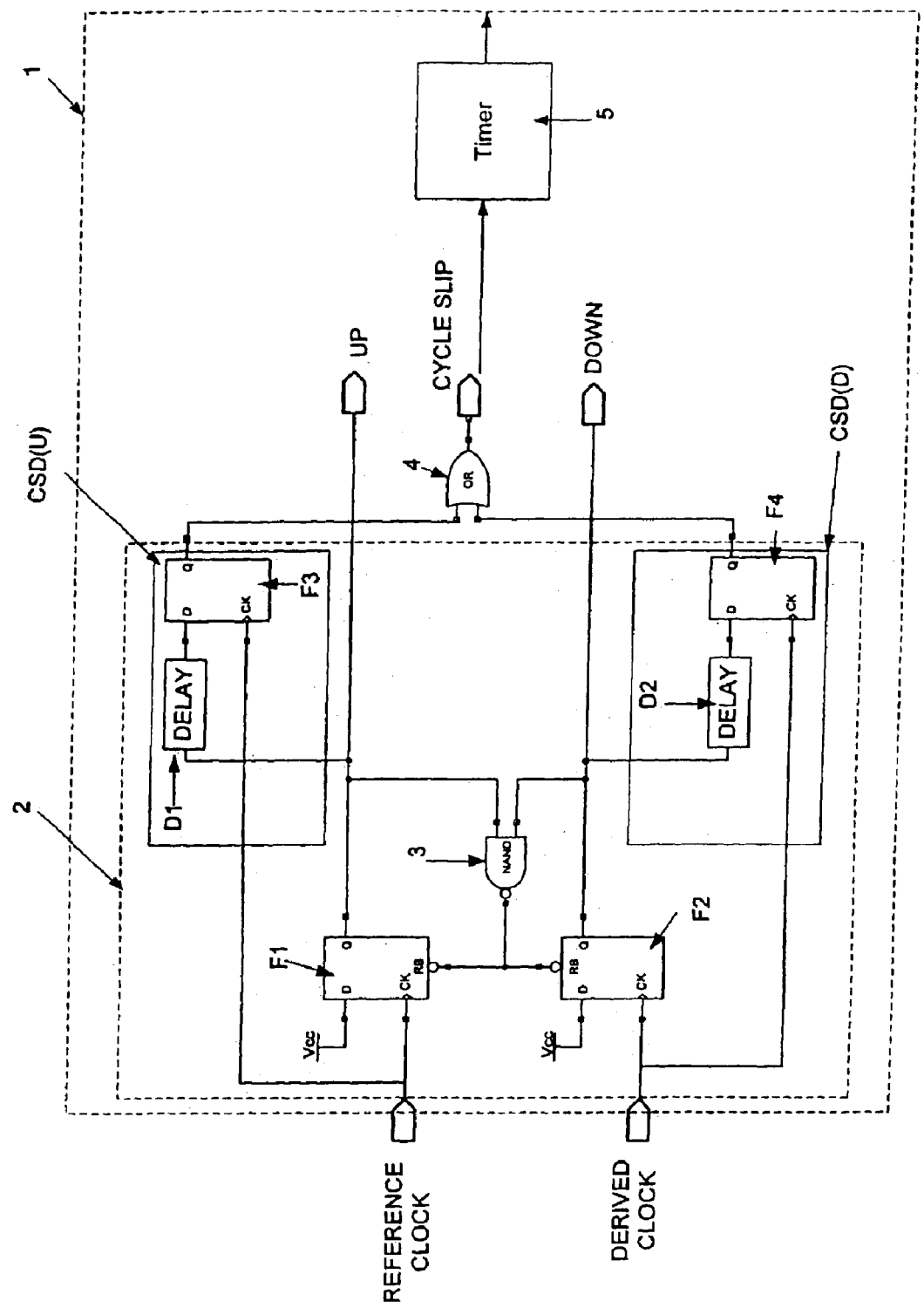
FIG. 4 is a circuit diagram of an embodiment.

FIG. 4 shows a PLL lock detector 1 according to an embodiment and comprising a cycle slip detector 2 and a timer circuit 5. The cycle slip detector 2 comprises a phase and frequency detector (PFD) having two input or PFD latch means F1 and F2 which are coupled respectively to a reference clock signal (REF) and a derived clock signal (DER) such as the output of a VCO, and a NAND gate 3. The outputs of the input latches F1 and F2 are coupled respectively to UP and DOWN cycle slip detector circuits (CSD(U) and CSD(D)) which each comprises a delay element D1 or D2 and an output or cycle slip latch means F3 or F4. The CK input of each output latch F3 and F4 is coupled to the respective clock input (reference or derived respectively).

The reference clock input is coupled to the CK input of a PFD latch F1, and the derived clock input to the CK input of other PFD latch F2. The D inputs of these latches F1 and F2 are coupled to a reference voltage such as the positive supply voltage Vcc. The outputs Q of the PFD latches F1 and F2 provide the PFD's UP and DOWN signals respectively, and are also coupled to the inputs of the NAND gate 3. The output of the NAND gate 3 is coupled to the reset (RB) inputs of the two input or PFD latches F1 and F2. Thus as a leading edge from each clock input signal arrives, the respective latch F1 or F2 asserts the reference voltage Vcc at its output Q. When both outputs Q of input latches F1 and F2 have gone to Vcc, the NAND gate 3 switches off, which in turn resets the two input latches F1 and F2 such that their outputs Q revert to 0V or ground until the next leading edge from their respective clock signal inputs. If the two input clock signals are in-phase then there will be virtually no output from the UP and DOWN signal outputs as soon as the latches latch, they will be reset by the NAND gate 3. However, if one of the clock signals leads the other, then the output of the corresponding latch F1 or F2 (UP or DOWN) goes to the reference voltage Vcc until the circuit is reset by the leading edge of the lagging clock signal.

Preferably the PFD latches F1 and F2 are simple NOR gate pairs as shown and described later with respect to FIG. 6. This minimises circuit complexity, chip area and hence cost, and power dissipation. It also minimises the delay time through each latch: this has two related benefits: (i) it will tend to minimise the mismatch between delays through the latches and hence reduce input phase error of the loop: (ii) further, since these delays will generally be supply-dependent, it will improve the power-supply rejection of the loop, thus avoiding contributing to the jitter of the derived clock. This advantage is particularly relevant for circuits which have to operate down to minimum supply voltage (e.g. battery powered portable equipment), where the propagation delay of gates will increase rapidly as the supply decreases to near its minimum practical voltage, yet small output jitter is still required.

Several variations of this circuit will be obvious to one versed in this field. Alternatively, the PFD latches may be some other type of flip-flop circuit, or any other suitable clock edge triggered type of circuit. The cycle slip latches F3 and F4 may be any type of latch device or circuit, although a D-type flip-flop is preferred for ease and cost of implementation. NAND gate 3 may be replaced by an AND gate and if necessary a logical inverter. If PFD latches F1 and F2 have Q-bar outputs, and a non-inverting reset input, NAND gate 3 could be replaced in function by a NOR gate driven from these Qbar outputs and driving non-inverting reset inputs of the modified PFD latches F1 and F2. Other combinatorial logic schemes may also be envisaged, possibly including other inputs (e.g. a system reset), but a simple NAND gate would generally be preferable in terms of speed and simplicity.

Figure 1:
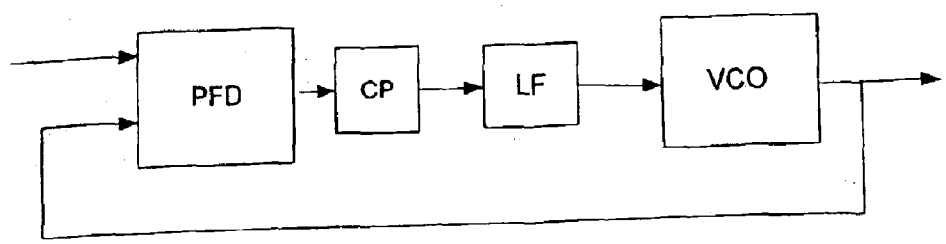
FIG. 1 shows a schematic of a phase lock loop (PLL) circuit.
Figure 2A:
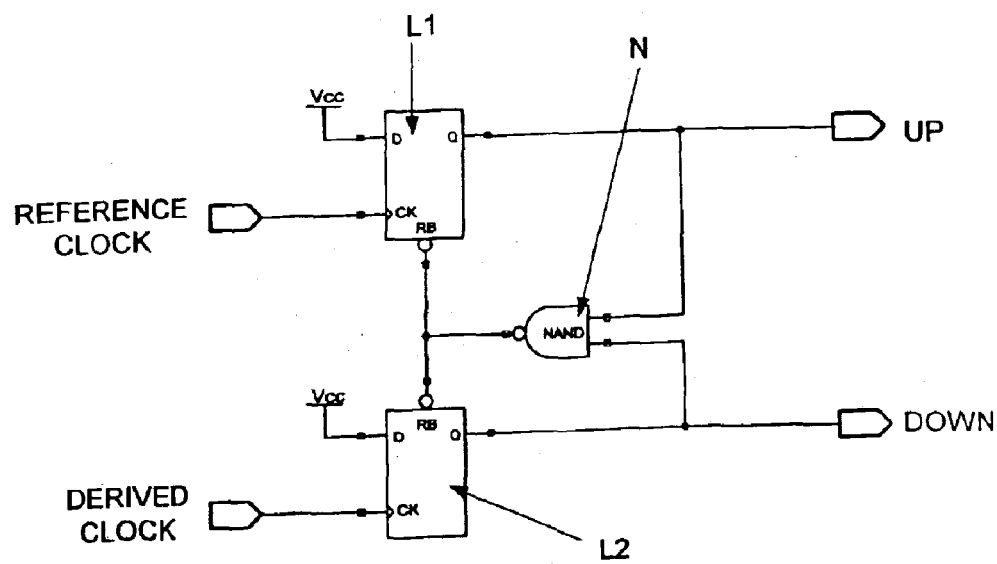
FIG. 2a shows a phase and frequency detector (PFD) circuit.

However, replacement of the generic latches L1 and L2 of FIG. 2a by the fast latches F1 and F2 reduces the propagation delay of F1 to only two fast gate delays. For a generic latch F3, this will probably violate the setup timing constraint of F3. For example, internal to F3, the CK input to F3 may itself be inverted and then have to switch a transmission gate completely off before the D input is isolated from subsequent logic stages. Thus a delay element D1 (and similarly D2) will generally be required for reliable logic operation.

The delay elements D1 and D2 can be any suitable circuit device or arrangement, for example two (or multiples of) logical inverters coupled in series between each PFD latch output and its respective cycle slip latch input. As discussed above, the propagation delay of simple inverter chains will increase rapidly as the supply voltage decreases to near its minimum value for functionality, so a more complex scheme may be necessary to reduce the supply dependence of this delay—for example schemes based on recharging a capacitance by means of a predictable and stable current source and sensing when this voltage passes a predictable and stable voltage threshold. Alternatively, a simple RC delay using lumped or even parasitic components may be adequate in some cases. The propagation delay introduced by these elements D1 and D2 is arranged such that it provides sufficient time following each input clock edge at the CK inputs of cycle slip latches F3 and F4, before the corresponding PFD latch output signal (UP or DOWN) arrives at the cycle slip latch's non-clocking input (D), to ensure that they respond to the previous PFD latch output signal and do not attempt to respond to this corresponding PFD latch output signal. This time will vary depending on the type of PFD (F1, F2) and cycle slip (F3, F4) latches implemented, and can be determined either from transistor-level simulation of the detailed circuit implementation or by reference to the respective manufacturer's or standard-cell IP vendor's latch device performance parameters.

Note that the incorporation of such a delay may not be obvious from the top-level schematic. In an alternative depiction of the circuit, the delay elements D1 and D2 may be embedded in the design of the cycle slip latches F3 and F4 rather than as separate circuit components. For example additional transistor stages may be added to the non-clocking inputs of the cycle slip latches, possibly with deliberate extra loading or weakened drive.

In yet a further alternative, some combinations of PFD and cycle slip latches may not require an additional quantifiable delay block, relying instead on the deliberately long propagation delay of a slow PFD latch F1 or F2 which combined with a fast resetting cycle slip latch may provide sufficient delay. For example, a Q-bar or delayed-Q output might be generated by one or more inverters or gates in series driven from the Q output of the PFD latch, and used to drive the respective cycle slip latches, while the undelayed Q output is still used to drive the reset of the PFD latches via NAND 3 or similar feedback logic.

Figure 3A:
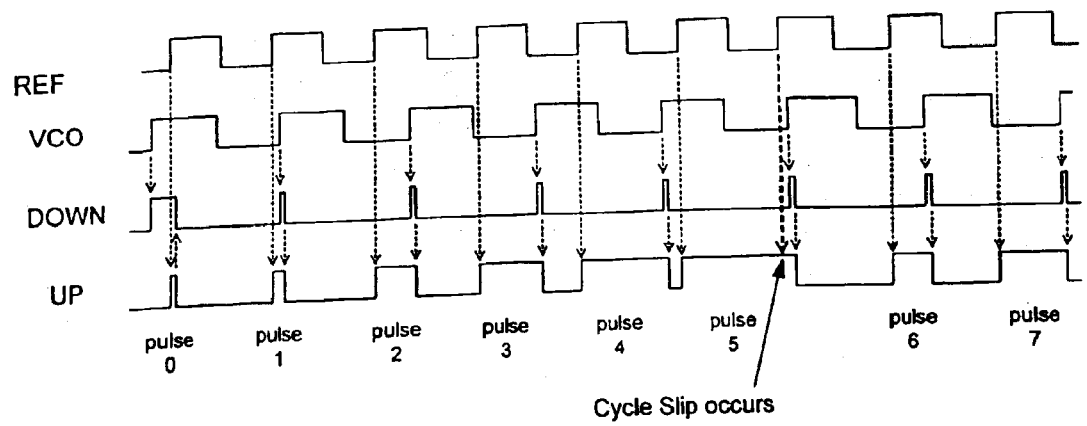
FIG. 3a shows a timing diagram showing signals in the circuit of FIG. 2.
Figure 3B:
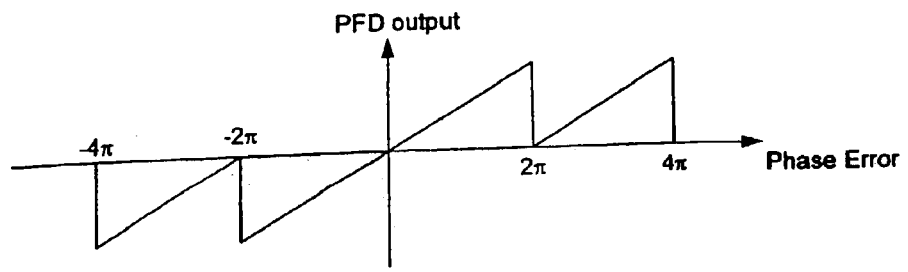
FIG. 3b shows the transfer characteristic of the circuit in FIG. 2.
Figure 3C:
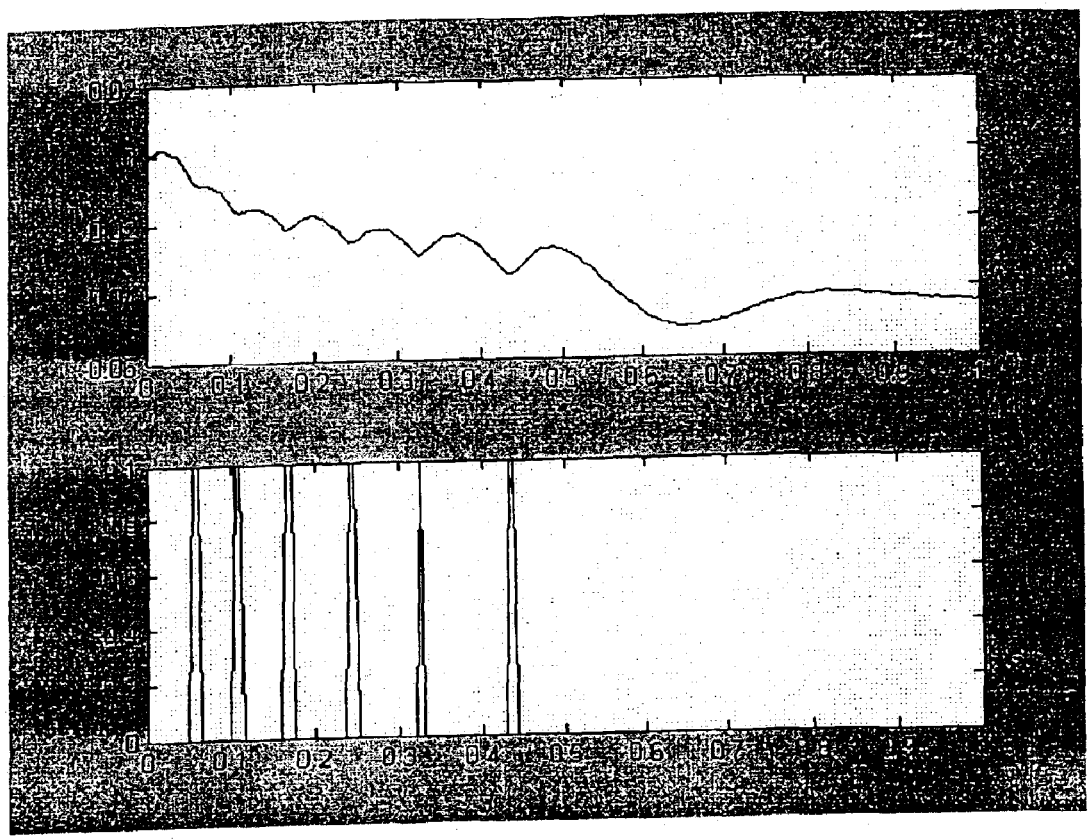
FIG. 3c shows a VCO control voltage and a cycle slip detector output when cycle slip is occurring.

In operation, the UP and DOWN signals of the PFD are delayed (by D1 and D2 respectively) and applied to the D input of a respective output latch F3 and F4 which in turn are clocked by the reference and derived clocks respectively. The various waveforms are shown in FIG. 5. This diagram shows the REF, DER, DOWN, and UP signals as in the previous FIG. 3a, but with the addition of signals at the D input and Q output of the output preferably D-type latch F3. As the phase lag of the DER signal progressively increases, the UP pulses lengthen, until eventually the phase lag exceeds $2\pi$ and an UP pulse is generated which also lasts for more than a REF cycle, followed by further pulses at a low duty cycle.

These UP pulses are delayed by a time $t_D$ by delay block D1, (in addition to the propagation delay $t_P$ of F1) and are then sampled by each rising edge of REF. Assuming the derived clock lags the reference clock by significantly less than $2\pi$, the PFD (F1, F2, 3) has already been reset by the arrival of the DER clock signal well beforehand, so the Q output of F3, F3.Q, is zero. However, if the DER edge has not occurred by the next rising edge of REF, UP will still be high and F3.Q will go high flagging the cycle slip of DER. As discussed above, the delay element D2 ensures that latch F4 does not respond to the short output pulse on F2 output.

Similarly, from the symmetry of the circuit, it can be shown that the latch F4 is only set if the accumulated lag of the REF clock relative to the DER clock exceeds $2\pi$ This circuit will also flag "cycle slips" when the phase lag is slightly less than $2\pi$, i.e. when the delay of DER relative to REF is actually ($t_D+t_P$) less than a REF period (neglecting here any interconnect delay in the path between the REF input and F3, and set-up and hold times of F3) So in practice the delay time $t_D$ of the delay elements D1 and D2 is preferably much less than half a REF clock period, to allow excursions of at least half a REF clock period due to transients while in lock.

As an absolute worst-case maximum, the delay time should in any case be smaller than the reference clock cycle duration less the reset time of the PFD in order to prevent continuous cycle slip detection when in lock. The minimum delay can be very short, enough to allow for the above delay of REF signal and set-up/hold times of F3 as described above.

Thus the modified PFD (F1, F2, 3, D1, F3, D2, F4) acts as a cycle slip detector 2. The output Q of the UP cycle slip detection circuit (D1, F3) indicates a cycle slip due to the reference clock having a slightly higher rate than the DER clock, and the output Q of the DOWN cycle slip detection circuit (D2, F4) indicates a cycle slip due to the DER clock having a slightly higher rate than the reference clock.

Because the circuit of FIG. 4 is so simple, four latches, a NAND gate and two delay blocks, the signal propagation associated with the circuit is minimal allowing very high frequency operation or a lower minimum supply voltage for given performance in terms of frequency of operation compared with prior art arrangements.

Figure 6:
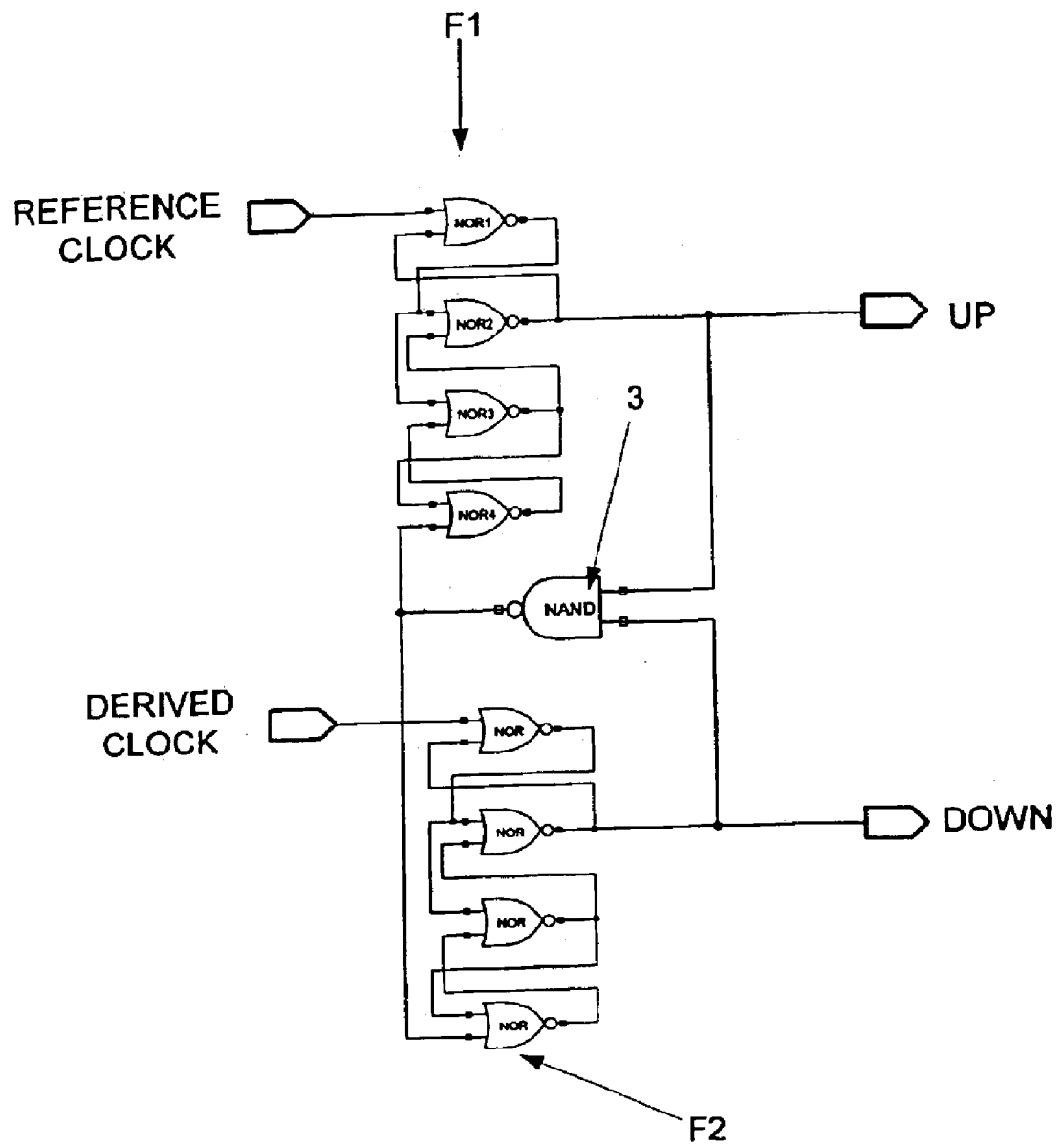
FIG. 6 shows a circuit arrangement for the PFD latch means of FIG. 4.

FIG. 6 shows a circuit arrangement for the PFD latches F1 and F2 which provides fast latching of the respective input signals (REF and DER) to provide respective PLL control output signals (UP and DOWN) very quickly. Each PFD latch F1 and F2 comprises two NOR gates NOR1 and NOR2 arranged into a flip flop circuit together with reset circuitry NOR3 and NOR4. Alternatively NAND gate pairs could be implemented, or a suitable combination of NAND and NOR gates.

This circuit can be further enhanced to provide a PLL lock detector 1. The two (UP and DOWN) cycle slip signals are logically "OR"ed together by the OR gate 4 to create a signal that is high when a (either UP or DOWN) cycle slip has occurred. This output is coupled to the timer circuit 5.

When the frequency difference between the derived and the reference clocks is small enough (i.e. within $2\pi$ of each other) the PLL is said to be in phase acquisition mode and the PFD output pulse duration is now proportional to the phase difference and the cycle slips no longer occur.

In general, as a loop starts up, cycle slips will occur frequently at first, and then progressively less frequently, until cycle slipping stops. There is an upper bound, $t_{csmax}$, to the time between cycle slips, determined by the non-linear dynamics of the loop. This upper bound may be numerically calculated using non-linear control theory, or more empirically by simulation of the loop under a range of initial conditions. If a cycle slip has not been detected within a moving window of $t_{csmax}$, then the PLL can be said to have been in a phase acquisition mode for this duration.

After the last cycle slip, the input signals remain within $2\pi$ phase difference of each other, and the loop dynamics become and remain linear. Standard linear control theory can be used to calculate the upper bound, $t_{settlemax}$ for the time required for the loop to settle to an arbitrary frequency error criterion, regardless of initial conditions, after the last cycle slip, i.e. to calculate the remaining maximum settling time. Dependent on loop characteristics and the error criterion chosen, $t_{settlemax}$ will be of the order of $2\pi/\omega_n$, where (on is the resonant frequency of the system.

Hence, if a time $t_{lock}=\max(t_{csmax}, t_{settlemax})$ passes with no cycle slips then the PLL is (to a first order approximation) locked. Hence the timer (analog or digital) 5 is used in conjunction with the cycle slip indicator signal to realize a PLL lock detect circuit. The output of the OR gate 4 resets the timer 5, and when the timer 5 has recorded a time of $t_{lock}$, without being reset by a cycle slip, then this indicates PLL lock. Typically $t_{settlemax}$ is greater than $t_{csmax}$, so $t_{lock}=t_{settlemax}$.

For an integrated circuit implementation with on-chip loop filter components, this settling time can be accurately predicted. For an off-chip filter and/or a circuit to operate over a wide range of bandwidths, some programmability of this delay may be desirable.

Figure 2B:
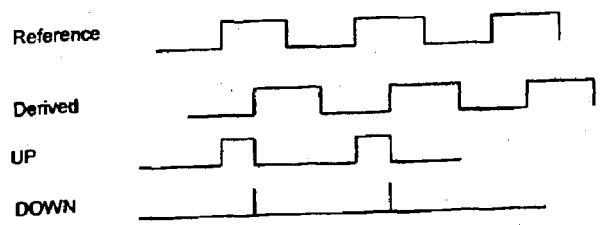

The embodiment whether as PFD modified to detect cycle slips (2) or as PLL lock detector (1) is simple, with reduced component count and connections leading to lower manufacturing costs. Further as each input signal cycle slip detector (CCD(U) or CCD(D)) consists of a delay element (D1 or D2) and a latch (F3 or F4) such as a "D-type" flip flop, no further logical circuitry is required to implement the cycle slip detector. Prior art cycle slip detectors such as those disclosed in U.S. Pat. Nos. 6,441,691 and 6,256,362 require logical components and more signals to detect a cycle slip. In addition, due to the reduced component count the circuit will function at higher frequencies and occupy less silicon area. For example compared with the circuit of FIG. 2 in US2002/0126787, there are only two circuit components (D1 and F3) from the UP output of the PFD circuit to the UP cycle slip indicator output (Q on F3). The prior art circuit on the other hand has up to five circuit components (34, 36, 26A, 22A, 24A) between the UP signal output and the UP cycle slip output. Because at least one signal needs to propagate through these five components in order for the circuit to work, the frequency at which this circuit can operate is limited by comparison with the arrangement of the embodiment. The improved operating frequency is particularly significant in the current and future communications industry where higher and higher frequencies are needed and being implemented to provide larger bandwidth channels for large data transfers.

Additionally, in the PLL lock detector implementation, this circuit also has the advantage of being dependent only on the PFD linear/non-linear mode of operation to detect lock rather than to the more typically method of checking when lock has occurred by looking at a voltage in the loop e.g. the voltage controlling the VCO and comparing it to the expected steady state value. When this voltage matches the correct speed of operation for the VCO, the VCO can be said to be locked. However these voltages can vary substantially with temperature and supply voltage and hence can only be used to indicate when the system is approximately locked. The lock circuit 1 of FIG. 4 is effectively a digital lock detect since the PFD (a digital circuit) is used to determine lock, on the basis of the polarity of its output at a particular time. At a gross level such digital circuitry is not dependent on temperature or supply voltage. By using the outputs from a digital circuit to determine lock, any effects due to noise, temperature and supply voltage can be avoided In an alternative embodiment, the cycle slip detector circuit 2 could be implemented together with a state machine to determine PLL lock; although this will result in more complex and hence slower circuitry.

The embodiments could also be implemented in software when used with a class of phase locked loops called software phase locked loops. These loops implement the PLL using software equivalents for each of the blocks. The PFD can be realised in software and this method could be used to determine lock. These phase locked loops would typically be run on a DSP core or microprocessor. Software PLLs are becoming more popular mainly due to the availability of cheap and easy to program DSP cores.

The cycle slip detector circuit 1 could also be implemented as part of a cycle slip correction circuit such as those described earlier. For these circuits the cycle slip would still be detected and used to detect lock. Additionally the output from the cycle slip detector 2 can then be used to drive correction circuitry to take account of the slip.

The embodiment could also be used with non-clock type signals, e.g. sine waves by squaring or converting the waves to square waves (e.g. by a comparator) prior to the PFD. Thus for a sine wave the leading edge positive going zero crossings would be squared-up to become rising edges of the respective digital input.

The embodiment could also be used to indicate when the PFD or a PLL is in phase difference mode or frequency difference mode. Cycle slip indication shows the circuit to be in frequency difference mode. This might be implemented simply with an OR gate taking inputs from the UP and DOWN cycle slip outputs of the detector 2. In general the maximum theoretical time between the last two cycle slip events prior to entering linear mode of operation will be shorter than the predicted linear settling time of the loop, i.e. the duration of the timer used to generate the "locked" signal. A timer of this former, shorter, duration could be added to give a pre-warning that the loop is about to be locked, which might be useful in reducing the initialisation time of downstream circuitry.

Figure 7A:
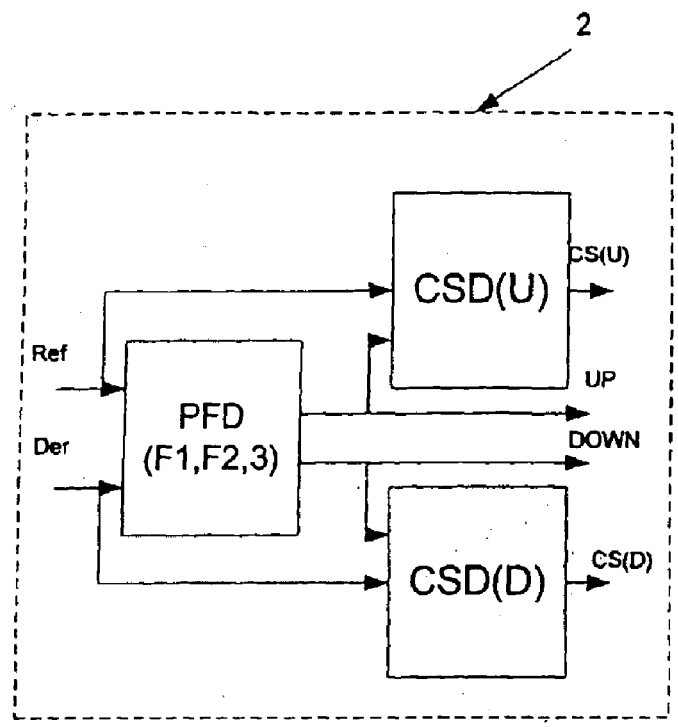
FIGS. 7a–7f show various circuit combinations corresponding to different applications corresponding to embodiments of the present invention.
Figure 7B:
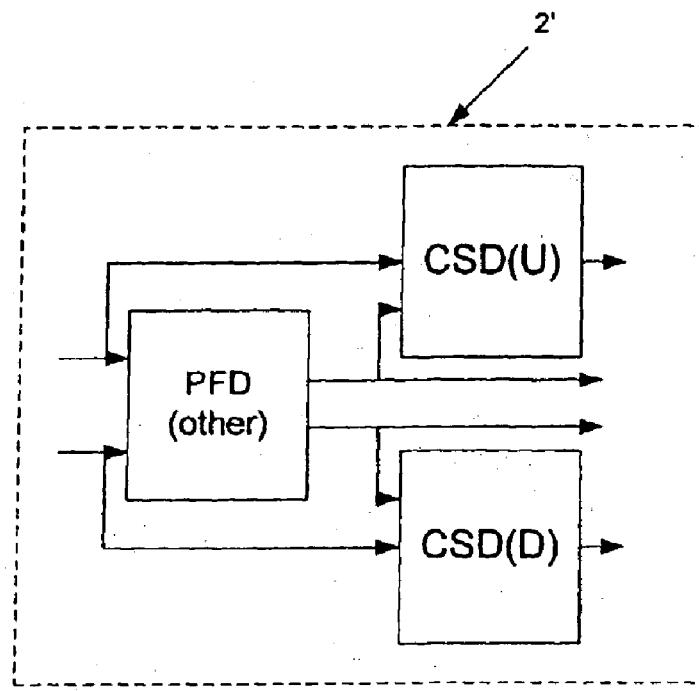

FIGS. 7a–7f show schematically various applications of the embodiment. FIG. 7a shows the modified PFD 2 of FIG. 4 implemented as a cycle slip detector. FIG. 7b shows another PFD circuit (including prior art examples) which has been modified with the addition of the UP and DOWN cycle slip detector circuits CSD(U) and CSD(D) described above with respect to FIG. 4 and components D1 and F3, and D2 and F4. The suitably modified PFD is now operable as a cycle slip detector.

Figure 7C:
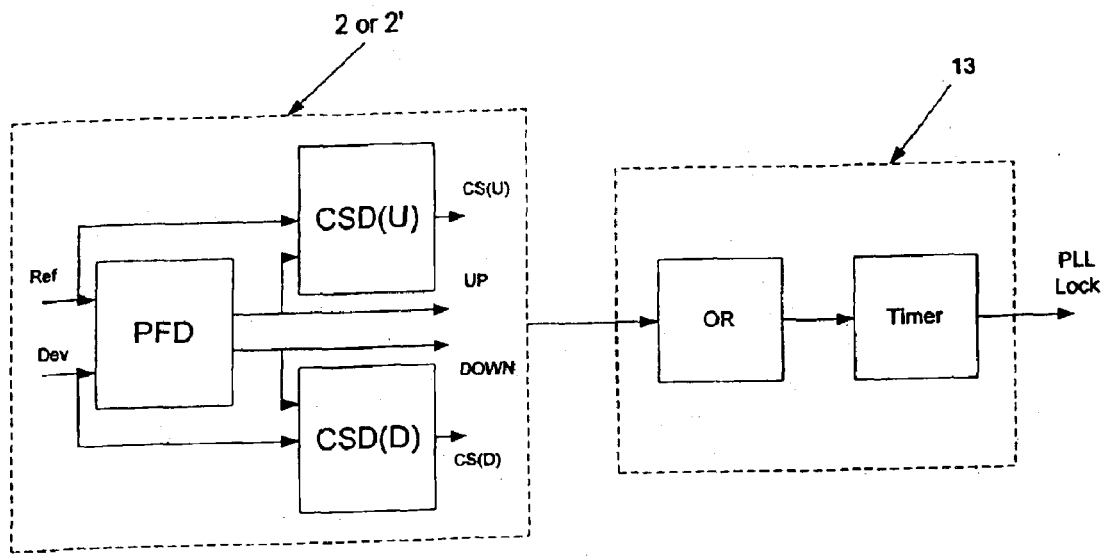

FIG. 7c shows a PLL lock detector implemented by adding logical OR and timer functions to the modified PFD circuits of FIGS. 7a and 7b. The UP cycle slip and DOWN cycle slip outputs are "OR'ed" together to indicate when any cycle slip has occurred. If a cycle slip hasn't occurred within a predetermined time, then the circuit arrangement indicates PLL lock.

Figure 7D:
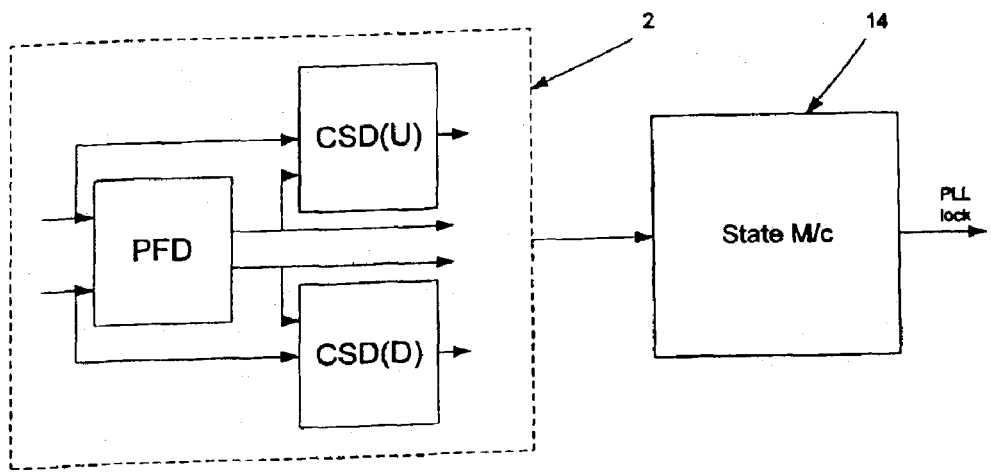

The circuit of FIG. 7d has the same application, but combines the modified PFD circuit 2 of FIG. 7a with a state machine (including any suitable prior art examples) to determine PLL lock.

Figure 7E:
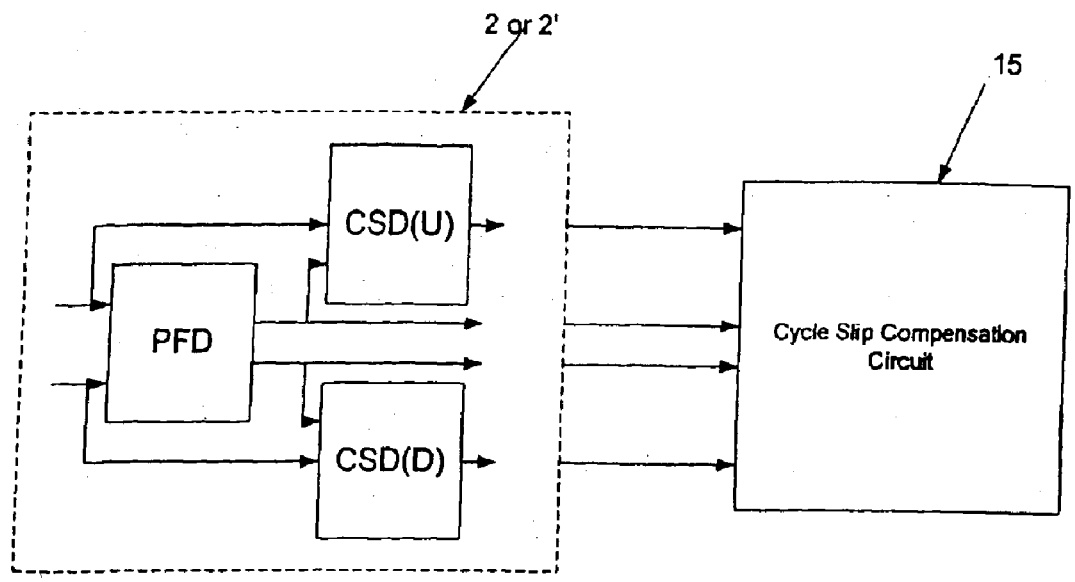

FIG. 7e shows a modified PFD circuit 2 or 2' as shown in FIG. 7a or 7b combined with a cycle slip correction circuit (including suitable prior art examples) in order to provide cycle slip correction for a PLL circuit.

Figure 7F:
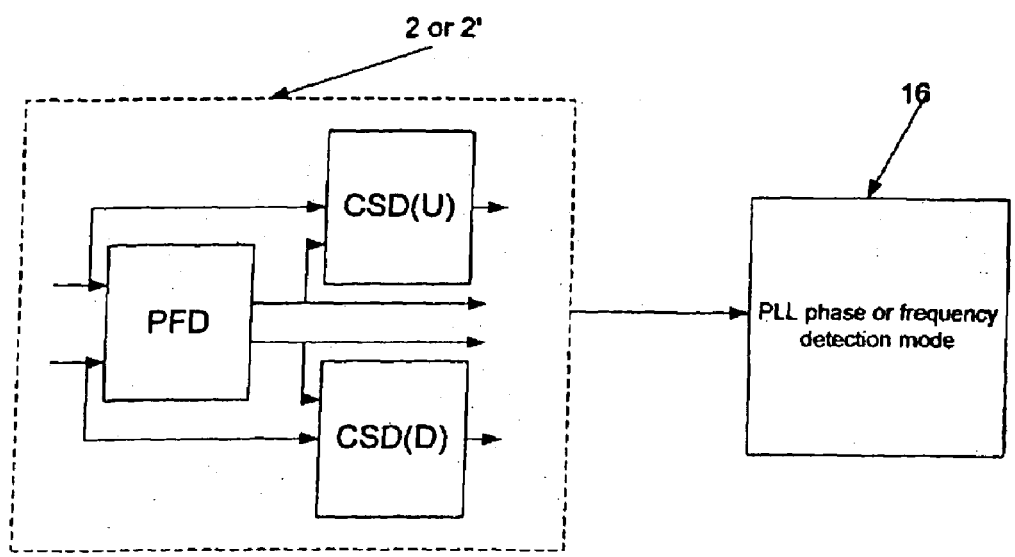

FIG. 7f shows the modified PFD circuit 2 or 2' of FIGS. 7a and 7b combined with a logical circuit to determine whether a PLL circuit is in frequency detection or phase detection mode. This can be done simply by monitoring the outputs of the UP and DOWN cycle slip outputs—a cycle slip indication showing the PLL to be in frequency detection mode.

Embodiments also utilise PLL's incorporating the above defined circuits. These will have many applications but are well suited to digital audio equipment such as CD players for example. For this equipment to work well, a stable clock or reference frequency input is needed. Thus PLL's according to the embodiments may be implemented to synthesise one or more clock frequencies from, for example a crystal clock or other frequency source. In particular this can be advantageously applied to the generation of standard frequency audio clocks (e.g. multiples of standard audio sample rates like 44.1 kHz or 48 kHz) from master clocks of for example 12 MHz from USB clock signals.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re-)programmable analog array or similar device in order to configure analog hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

What is claimed is:

1. A cycle slip detector circuit comprising:
a phase and frequency detector circuit having first and second latches each having an input for receiving respective first and second input signals and arranged to provide respective first and second control signal outputs responsive to a predetermined part of the waveform of the first or second input signals;
third and fourth latches each having a first input coupled to a respective control signal output and a second input coupled to the respective first or second latch input corresponding to said control signal output;
delay means arranged to provide a predetermined delay between each said control signal and the respective third or fourth latch means.

2. A circuit according to claim 1 wherein the delay means is embedded in the circuitry of the third and fourth latches or in the first and second latches or in a combination.

3. A circuit according to claim 2 wherein the third and fourth latches each comprise an addition circuit stage on the input coupled to the respective control signal output.

4. A circuit according to claim 1 wherein the delay means comprises separate circuit elements between the first and third and the second and fourth latches respectively.

5. A circuit according to claim 4 wherein the separate circuit elements comprise a logic device.

6. A circuit according to claim 1 wherein the predetermined delay is less than the remainder of the input signal period less the reset time of the phase and frequency detector circuit.

7. A circuit according to claim 1 wherein the predetermined delay is sufficient to delay an output signal from the first or second latches to the respective third or fourth latches input until said third or fourth latches output signal has responded to the first or second input signal to which said output signal responded.

8. A circuit according to claim 7 wherein the first and second latches are fast flip flop circuits.

9. A circuit according to claim 8 wherein said fast flip flop circuits are NOR or NAND gate pairs.

10. A circuit according to claim 7 wherein the third and fourth latches are slow latch circuits.

11. A circuit according to claim 10 wherein the slow latch circuits are D-type flip flops.

12. A lock detector circuit for a phase lock loop having a phase and frequency detector; the lock detector comprising:
a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;
third and fourth latches each having a first input coupled to a respective control signal output and a second input coupled to the respective first or second latch, input corresponding to said control signal output;
delay means arranged to provide a predetermined delay between each said control signal and the respective third or fourth latch means; and
a circuit arranged to indicate lock when output signals indicating a cycle slip from the third or fourth latches have not been asserted for a predetermined time.

13. A circuit according to claim 12 wherein the predetermined delay is sufficient to delay an output signal from the first or second latches to the respective third or fourth latches input until said third or fourth latches output signal has responded to the first or second input signal to which said output signal responded.

14. A circuit according to claim 12 wherein the lock indication circuit comprises combining circuit for logically combining the outputs of said third and fourth latches, and a timer circuit coupled to the output of said combining circuit.

15. A circuit according to claim 12 wherein the predetermined time is approximately the predicted post-cycle-slip settling time of the loop.

16. A circuit according to claim 15 wherein the predetermined time is approximately 2 pi/wn.

17. A phase or frequency mode indicator circuit for a phase lock loop, the circuit comprising:
a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;
third and fourth latches each having a first input coupled to a respective control signal output and a second input coupled to the respective first or second latch, input corresponding to said control signal output;
delay means arranged to provide a predetermined delay between each said control signal and the respective third or fourth latch means;
a circuit arranged to indicate a phase or frequency mode dependent on whether said cycle slip detector circuit indicates cycle slips.

18. A phase lock loop circuit comprising a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;

third and fourth latches each having a first input coupled to a respective control signal output and a second input coupled to the respective first or second latch, input corresponding to said control signal output;

delay means arranged to provide a predetermined delay between each said control signal and the respective third or fourth latch means.

19. A phase lock loop circuit comprising a lock detector circuit comprising:

a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;

third and fourth latches each having a first input coupled to a respective control signal output and a second input coupled to the respective first or second latch, input corresponding to said control signal output;

delay means arranged to provide a predetermined delay between each said control signal and the respective third or fourth latch means;

a circuit arranged to indicate lock when output signals indicating a cycle slip from the third or fourth latches have not been asserted for a predetermined time.

20. A phase lock loop circuit comprising a phase of frequency mode indicator circuit comprising:

a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;

third and fourth latches each having a first input coupled to a respective control signal output and a second input coupled to the respective first or second latch, input corresponding to said control signal output;

delay means arranged to provide a predetermined delay between each said control signal and the respective third or fourth latch means;

a circuit arranged to indicate phase or frequency mode dependent on whether said cycle slip detector indicates cycle slips.

21. A clock frequency synthesiser comprising a phase lock loop circuit comprising a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;

third and fourth latches each having a first input coupled to a respective control signal output and a second input coupled to the respective first or second latch, input corresponding to said control signal output;

delay means arranged to provide a predetermined delay between each said control signal and the respective third or fourth latch means.

22. Digital audio apparatus comprising a phase lock loop circuit comprising a cycle slip detector circuit comprising a phase and frequency detector circuit having first and second latches each having an input for receiving respective first and second input signals and arranged to provide respective first and second control signal outputs responsive to a predetermined part of the waveform of the first or second input signals;

third and fourth latches each having a first input coupled to a respective control signal output and a second input coupled to the respective first or second latch, input corresponding to said control signal output;

delay means arranged to provide a predetermined delay between each said control signal and the respective third or fourth latch means.

\* \* \* \* \*